(12) United States Patent
Chow et al.

(10) Patent No.: US 10,401,433 B2
(45) Date of Patent: Sep. 3, 2019

(54) METHOD AND APPARATUS FOR ESTIMATING BATTERY LIFE

(71) Applicants: Samsung Electronics Co., Ltd., Suwon-si (KR); North Carolina State University, Raleigh, NC (US)

(72) Inventors: Mo-Yuen Chow, Raleigh, NC (US); Habiballah Rahimi Eichi, Raleigh, NC (US); Taejung Yeo, Yongin-si (KR); Paul Barom Jeon, Seoul (KR)

(73) Assignees: Samsung Electronics Co., Ltd., Suwon-si (KR); North Carolina State University, Raleigh, NC (US)

( * ) Notice: Subject to any disclaimer, the term of this patent is extended or adjusted under 35 U.S.C. 154(b) by 818 days.

(21) Appl. No.: 14/601,819

(22) Filed: Jan. 21, 2015

(65) Prior Publication Data
US 2016/0209472 A1    Jul. 21, 2016

(51) Int. Cl.
| | | |
|---|---|---|
| *G01R 31/36* | (2019.01) | |
| *B60K 37/02* | (2006.01) | |
| *G01R 31/371* | (2019.01) | |
| *G01R 31/382* | (2019.01) | |
| *B60L 58/12* | (2019.01) | |

(52) U.S. Cl.
CPC .......... *G01R 31/3648* (2013.01); *B60K 37/02* (2013.01); *B60L 58/12* (2019.02); *G01R 31/371* (2019.01); *G01R 31/382* (2019.01); *B60K 2350/1064* (2013.01); *B60K 2350/1092* (2013.01); *Y02T 10/84* (2013.01)

(58) Field of Classification Search
None
See application file for complete search history.

(56) References Cited

U.S. PATENT DOCUMENTS

| | | | | |
|---|---|---|---|---|
| 2010/0312744 A1* | 12/2010 | Prokhorov | ......... | G01R 31/3679 706/52 |
| 2012/0200266 A1* | 8/2012 | Berkowitz | .......... | B60L 11/1861 320/139 |
| 2012/0274285 A1* | 11/2012 | Chawla | ................. | H01M 10/44 320/127 |
| 2014/0379199 A1* | 12/2014 | Schulz | ................. | B60W 40/12 701/29.2 |

FOREIGN PATENT DOCUMENTS

| | | |
|---|---|---|
| JP | 2008-126788 A | 6/2008 |
| JP | 2013-225441 A | 10/2013 |
| JP | 2014-20804 A | 2/2014 |
| JP | 2014-55896 A | 3/2014 |
| KR | 10-2013-0036712 | 4/2013 |

\* cited by examiner

*Primary Examiner* — Cory W Eskridge
(74) *Attorney, Agent, or Firm* — NSIP Law

(57) ABSTRACT

A method and apparatus for estimating battery life are provided. A method of estimating battery life may involve estimating first status information of a battery based on battery information acquired from the battery, estimating second status information of the battery using a partial cycle model corresponding to a battery degradation pattern for a partial cycle, and calculating the battery life based on a comparison between the first status information and the second status information.

21 Claims, 10 Drawing Sheets

METHOD AND APPARATUS FOR ESTIMATING BATTERY LIFE

BACKGROUND

1. Field

The following description relates to a method and apparatus for estimating battery life.

2. Description of Related Art

Many electronic devices are equipped with a battery, such as a secondary battery, that is repeatedly charged during the longevity of the device. As a number of times a secondary battery is discharged and recharged increases, the capacity of the battery may become gradually reduced. That is, with each charge cycle, the battery life for the electronic device is shortened. Due to the reduction in the battery life, an initial battery capacity may not be guaranteed after many cycles of charging and discharging. With the continual reduction in battery capacity, the power, operating time and stability of the electronic device may become compromised, and eventually the battery may have to be replaced with a replacement battery.

A battery in an electronic device with a compact size such as, for example, a mobile phone may be easily replaced; thus, great inconvenience is not imposed on the user even if the user cannot verify when the batter needs to be replaced in advance. On the other hand, the replacement of a battery in an electric vehicle (EV) may require great expenditure and considerable time. Accordingly, it is important for the user to accurately determine the expected time for replacing such a battery. The expected time for replacing a battery may be estimated by determining a life state of the battery, in quantities such as, for example, a remaining useful life (RUL).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of estimating battery life involving estimating first status information of a battery, based on battery information acquired from the battery, estimating second status information of the battery, using a partial cycle model corresponding to a battery degradation pattern for a partial cycle, and calculating the battery life based on a comparison between the first status information and the second status information.

The calculating may involve, in response to the first status information differing from the second status information, adjusting the partial cycle model.

The calculating may involve, in response to the first status information being identical to the second status information, calculating the battery life from user history information using the partial cycle model.

The battery life may correspond to a remaining useful life of the battery. The calculating of the battery life from user history information may involve extracting statistical information associated with the partial cycle from the user history information, estimating third status information of the battery, based on the statistical information; and estimating the remaining useful life based on the third status information.

The estimating of the third status information may involve estimating, as the third status information, at least one of a capacity and an internal resistance estimated from a predictive partial cycle count estimated from the statistical information using the partial cycle model.

The partial cycle model may be a model to which a full cycle model associated with a degradation caused by a full charge and discharge of the battery is transformed.

The estimating of the first status information may involve estimating, as the first status information, an internal parameter of an equivalent model corresponding to the battery from the battery information using the equivalent model.

The estimating of the internal parameter may involve estimating, as the first status information, at least one of a capacity and an internal resistance from the battery information using a state space corresponding to the equivalent model.

The estimating of the second status information may involve estimating, as the second status information, at least one of a capacity and an internal resistance estimated from a partial cycle count of the battery using the partial cycle model.

The battery information may include at least one of a voltage, a current, a temperature, a cycle count, and a partial cycle count of the battery.

In another general aspect, an apparatus for estimating battery life includes a first estimator configured to estimate first status information of a battery, based on battery information acquired from the battery, a second estimator configured to estimate second status information of the battery, using a partial cycle model corresponding to a battery degradation pattern for a partial cycle, and a life calculator configured to calculate the battery life based on a comparison between the first status information and the second status information.

In response to the first status information differing from the second status information, the life calculator may be configured to adjust the partial cycle model.

In response to the first status information being identical to the second status information, the life calculator may be configured to calculate the battery life from user history information using the partial cycle model.

The battery life may correspond to a remaining useful life of the battery. The life calculator may be configured to extract statistical information associated with the partial cycle from the user history information, to estimate third status information of the battery, based on the statistical information, and to estimate the remaining useful life based on the third status information.

The life calculator may be configured to estimate, as the third status information, at least one of a capacity and an internal resistance estimated from a predictive partial cycle count estimated from the statistical information using the partial cycle model.

The general aspect of the apparatus may further include a model storage configured to store the partial cycle model to which a full cycle model associated with a degradation caused by a full charge and discharge of the battery is transformed.

The first estimator may be configured to estimate, as the first status information, an internal parameter of an equivalent model corresponding to the battery from the battery information using the equivalent model.

The first estimator may be configured to estimate, as the first status information, at least one of a capacity and an internal resistance from the battery information using a state space corresponding to the equivalent model.

The second estimator may be configured to estimate, as the second status information, at least one of a capacity and an internal resistance estimated from a partial cycle count of the battery using the partial cycle model.

The battery information may include at least one of a voltage, a current, a temperature, a cycle count, and a partial cycle count of the battery.

In yet another general aspect, an apparatus for estimating battery life includes a sensor configured to detect battery performance information of a battery that powers a device, and a processor configured to retrieve historic data regarding partial charge cycles of the device from a memory storage, and to estimate a battery life of the battery for use with the device based on the battery performance information and the historic data.

The battery life may correspond to a remaining useful life of the battery. The sensor may be configured to measure at least one of a voltage, a current, a temperature, a cycle count and a partial cycle count of the battery.

The historic data may include statistical information associated with past charge cycles of the device, and the processor may be configured to apply a partial cycle model corresponding to a battery degradation pattern to the battery performance information and the historic data to estimate the remaining useful life of the battery in the device.

In another general aspect, an electric vehicle includes a battery compartment configured to hold a battery, and the general aspect of the apparatus described above, in which the apparatus further includes a display screen configured to output information regarding the battery life to a dashboard of the electric vehicle.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
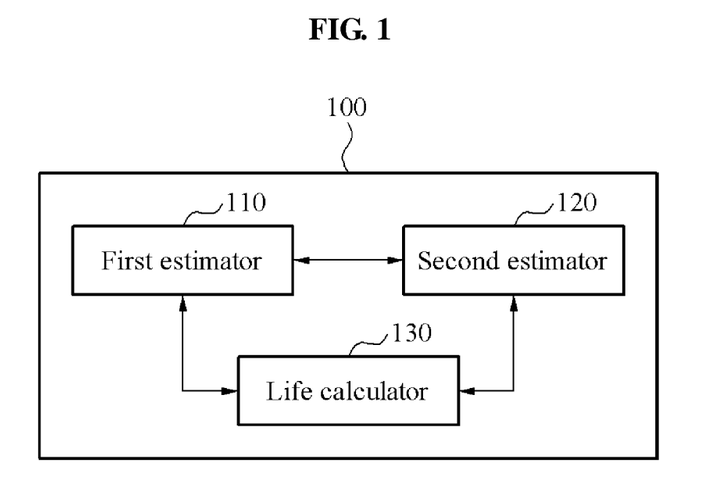
FIG. 1 is a block diagram illustrating an example of a configuration of an apparatus for estimating a remaining useful life of a battery.

FIG. 1 illustrates an example of an apparatus 100 for estimating the remaining useful life (RUL) of a battery.

Referring to FIG. 1, the apparatus 100 includes a first estimator 110, a second estimator 120, and a life calculator 130.

The first estimator 110 estimates first status information of the battery, based on battery information acquired from the battery. The first status information may include, for example, an internal parameter of an equivalent model corresponding to the battery from the battery information using the equivalent model. The internal parameter may include, for example, a capacity, a capacitance, or an internal resistance of a battery.

The second estimator 120 estimates second status information of the battery, using a partial cycle model corresponding to a battery degradation pattern of a partial cycle. The second status information may include, for example, an internal parameter estimated from a number of partial cycles of the battery using the partial cycle model. The internal parameter may include, for example, a capacity, a capacitance, or an internal resistance of a battery.

The life calculator 130 calculates the remaining useful life based on a comparison between the first status information and the second status information. The remaining useful life may refer to a duration of time left until the battery is predicted to reach an end of life (EOL). For example, the EOL of a battery may refer to a time at which the life of the battery ends or the battery must be replaced, with a ratio of the current capacity of the battery to the initial capacity being equal to or less than a predetermined ratio, such as 80%. A capacity of the battery refers to a maximum amount of charge that may be stored in the battery. The capacity may be measured in milliampere hour (mAh).

For example, an EOL of a battery used as a criterion of a remaining useful life may refer to a point in time at which the battery is incapable of supporting an electric vehicle for a typical driving profile for a day. The typical driving profile may be acquired from a user history.

Additionally, a point in time at which a fully charged battery reaches a discharge limit that is defined as a state of charge (SOC) of 10% or a low cut-off voltage may be determined based on an internal resistance and a capacity of the battery. A full capacity may indicate an actually available battery capacity. When the number of times a battery is charged and discharged increases, the capacity of the battery may be reduced below the initial capacity (for example, a rated capacity or a nominal capacity) of the battery. In this example, the full capacity may be an amount of available charge stored in the battery. Such a full capacity may be represented as an amount of charge to be released or stored at a charge and discharge (charge/discharge) rate.

A typical battery degradation model for predicting the battery life may utilize, for example, a voltage value or a current value of a battery that is measured by repeating the cycles of a full charge and a full discharge. However, to accurately predict a remaining useful life and a guaranteed life of a battery, it is desirable to consider that each of devices that is coupled to a battery, such as an electric vehicle, may operate with various operating power and energy requirements and different charge/discharge tendencies within a predetermined amount of time. Additionally, a future operation of a device such as an electric vehicle may depend on a probabilistic behavior of a hypothetical driver and a hypothetical operation condition.

In various examples, a method and apparatus for estimating a remaining useful life of a battery may apply a statistical analysis scheme to user history information, in order to accurately estimate the remaining useful life despite the partial charging and discharging of the battery. For example, a remaining useful life for partial charge/discharge may be estimated by a partial cycle model. In this example, when an internal resistance and a capacity of the battery that are updated in real time are determined to be different from values estimated by the partial cycle model, the partial cycle model may be modified.

Additionally, a statistical analysis for user history information may be used to predict future use of the battery. Accordingly, a future internal resistance and a future capacity of the battery may be predicted. Based on predictive values of the future internal resistance and the future capacity, the remaining useful life and the guaranteed life may be accurately estimated.

An operation of each of the first estimator 110, the second estimator 120, and the life calculator 130 will be further described below.

Figure 2:
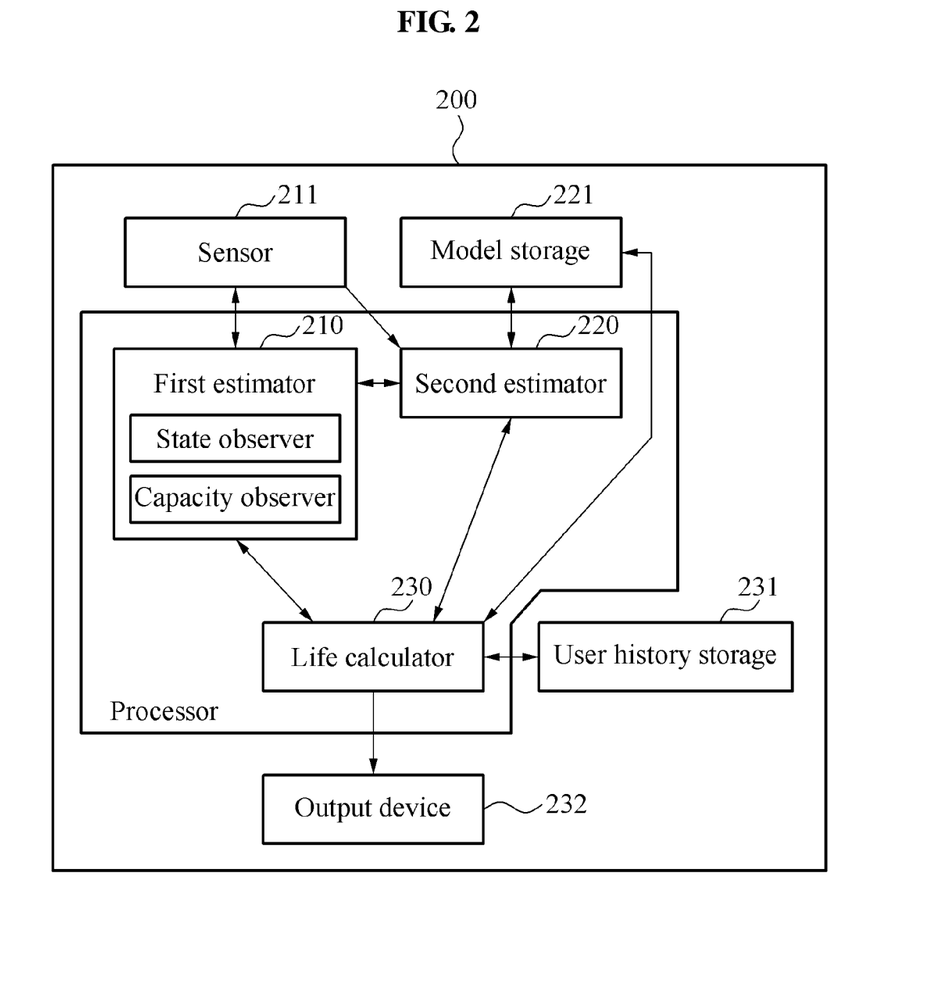
FIG. 2 is a block diagram illustrating another example of a configuration of an apparatus for estimating a remaining useful life of a battery.

FIG. 2 illustrates an example of an apparatus 200 for estimating a remaining useful life of a battery.

Referring to FIG. 2, the apparatus 200 includes a sensor 211, a first estimator 210, a second estimator 220, a model storage 221, a life calculator 230, a user history storage 231, and an output device 232. The first estimator 210, the second estimator 220 and the life calculator 230 may be implemented in one or more processors.

The sensor 211 detects information regarding a battery. The battery information may include, for example, a voltage of a battery, a current such as the current to and from the battery, or a temperature of the battery. The sensor 211 may include a voltmeter, an ammeter, or other electric circuit components, but the types of sensors 211 are not limited thereto.

The first estimator 210 estimates first status information, based on the battery information sensed by the sensor 211. The first estimator 210 may include a state observer and a capacity observer. The state observer may observe the battery based on a state space (for example, a state space equation) and an equivalent model of the battery. The capacity observer may estimate an actual capacity of the battery in real time. The state observer and the capacity observer will be further described with reference to FIGS. 3 through 5. The state observer and the capacity observer may be implemented in one or more processors.

The model storage 221 includes a non-transitory computer memory that stores model data. The model storage 221 may store a partial cycle model to which a full cycle model associated with a degradation caused by a full charge/discharge of a battery is transformed. Additionally, the model storage 221 may store the full cycle model and the partial cycle model. The full cycle model may refer to a battery degradation model obtained by modeling a degradation in a battery capacity caused by a number of full cycles, and the partial cycle model may refer to a battery degradation model obtained by modeling a degradation in a battery capacity caused by a number of partial cycles. The partial cycle model may include, for example, a model parameter of a function in which the number of partial cycles is used as an input variable and a battery capacity is used as an output.

In the present disclosure, the expressions "a full cycle" and "full cycling" may refer to a cycle and cycling in which a battery is fully charged and discharged, or a cycle and cycling in which a battery is fully discharged and fully charged. Additionally, the expressions "a partial cycle" and "partial cycling" may refer to a cycle and cycling in which a battery is partially charged or partially discharged, or a cycle or cycling in which a battery is partially discharged and partially charged. The partial cycle may, for example, correspond to a cycle in which a battery in a fully charged state is discharged until a capacity of the battery drops to 90% and is then recharged, or a cycle in which a battery in an 80% charged state is discharged until a capacity of the battery drops to 50% and is recharged to a higher charged state.

Furthermore, in the present disclosure, a number of full cycles may be referred to as a "full cycle count," and a number of partial cycles may be referred to as a "partial cycle count."

For example, the full cycle model may provide a degradation in an internal resistance and a capacity of a battery during charging of a fully discharged battery. However, in a real life, full cycling may hardly occur. Typically, a user may tend to charge a battery in a device, before the battery is fully discharged.

The full cycle model may be acquired from an experiment result. For example, to acquire a full cycle model, a battery may be fully discharged and charged during a single full cycle, and an internal resistance and a capacity of a battery may be measured every 50 full cycles. A mathematical model in which an internal resistance and a capacity of a battery is used as an output and a full cycle count is used as an input may be acquired as a full cycle model. The mathematical model may be acquired based on a curve fitting method. For example, a degradation in a battery capacity for a full cycle count may be represented as shown in Equation 1 below.

$$C_{degradation} = f_1(Cycle_{full}) \qquad [\text{Equation 1}]$$

In Equation 1, $C_{degradation}$ denotes a current capacity of a degraded battery, $Cycle_{full}$ denotes a full cycle count, and $f_1$ denotes a function corresponding to a curve representing a capacity of a battery with respect to a full cycle count.

In an example, a battery degradation caused by 20% partial cycling that is performed twice may differ from a battery degradation caused by 40% partial cycling that is performed once. For example, in the 20% partial cycling, a battery in a fully charged state may be used twice until a capacity of the battery drops to 80%. In the 40% partial cycling, a battery in a fully charged state may be used once until a capacity of the battery drops to 60%.

A correlation between a degradation caused by full cycling and a degradation caused by partial cycling may be obtained. For example, to measure a degradation in a battery caused by partial cycling, the battery may be discharged until a DOD of 0% is increased to 10% to 80%, and a capacity of the battery may be measured every 10 partial cycles. Accordingly, the same partial cycle count as 50 full cycles that cause the capacity of the battery to be degraded may be acquired. Additionally, to increase an accuracy, the above-described process may be performed for each of 100 cycles. A correlation between a full cycle and a partial cycle that have different depths of discharge (DoD) may be represented as shown in Equation 2 below.

$$Cycle_{full} = f_2(Cycle_{partial})$$ [Equation 2]

In Equation 2, $Cycle_{full}$ denotes a full cycle count, $Cycle_{partial}$ denotes a partial cycle count, and $f_2$ denotes a function representing a correlation between a full cycle count and a partial cycle count. The partial cycle count $Cycle_{partial}$ may refer to a number of times each of partial cycles occurs, and the function $f_2$ may represent a correlation between a full cycle and a number of times each of partial cycles occurs. A partial cycle may be, for example, a cycle in which a battery is discharged from an DOD of 10%, or a cycle in which a battery is discharged from an DOD of 20%. For example, an output variable, that is, $Cycle_m$ corresponding to a plurality of input variables, that is, $Cycle_{partial}$ may be derived from the function $f_2$.

However, the partial cycle may not be limited thereto. Accordingly, the partial cycle may include all cycles for various intervals of an SOC, for example, a cycle in which a battery is partially discharged until an SOC is changed from 100% to 90%, or a cycle in which a battery is partially charged until an SOC is changed from 70% to 90%.

A DOD refers to an alternate method to indicate a state of a battery. A DOD of 0% may indicate a state in which a battery is not discharged (for example, an SOC of 100%), and a DOD of 100% may indicate a state in which a battery is fully discharged (for example, an SOC of 0%). Because a battery may discharge a little more even after use of the battery by an indicated capacity, a DOD may exceed 100%, which may not be represented by an SOC. By combining Equations 1 and 2, Equation 3 that represents a battery degradation caused by a partial cycle may be obtained as shown below.

$$C_{degradation} = f_3(Cycle_{partial})$$ [Equation 3]

In Equation 3, $C_{degradation}$ denotes a capacity of a degraded battery, $Cycle_{partial}$ denotes a partial cycle count, and $f_3$ denotes a function corresponding to a curve representing a capacity of a battery with respect to a partial cycle count.

Equations 1 to 3 are associated with a capacity of a battery. A partial cycle model and a full cycle model associated with an internal resistance of a battery may also be acquired using similar schemes.

Additionally, to reduce a learning time of a partial cycle model and a full cycle model, a temperature of surroundings of a battery may be increased using a temperature chamber, thereby accelerating the rate of battery degradation.

The second estimator 220 may estimate, as second status information, at least one of the internal resistance and the capacity that are estimated from the partial cycle count of the battery based on the partial cycle model. The second estimator 220 may be implemented in one or more processors.

In the event that the first status information is identical to the second status information, the life calculator 230 may calculate the remaining useful life from user history information, using the partial cycle model. For example, in response to a difference between the first status information and the second status information being equal to or less than a predetermined difference, the life calculator 230 may determine that the first status information and the second status information are identical to each other.

For example, the life calculator 230 may extract statistical information associated with a partial cycle from user history information, may estimate third status information of the battery based on the statistical information, and may estimate the remaining useful life based on the third status information. The third status information may include, for example, information associated with a change in a future internal resistance and a future capacity of a battery based on a user history. The statistical information may be information associated with a probability that the partial cycle extracted from the user history information occurs, and may include, for example, a probability distribution map of the partial cycle. The life calculator 230 may estimate a predictive partial cycle count from the statistical information. The predictive partial cycle count may refer to a number of times a partial cycle is predicted to occur.

The life calculator 230 may utilize a Markov process model, a neural network, and the like, to extract the statistical information from the user history information.

In the event that the first status information differs from the second status information, the life calculator 230 may adjust the partial cycle model. For example, the life calculator 230 may adjust the partial cycle model, using a least square fitting technique so that the difference between the first status information and the second status information is equal to or less than the predetermined difference. The life calculator 230 may change a model parameter of the partial cycle model, to allow the second status information to be similar to the first status information. Additionally, the life calculator 230 may adjust the partial cycle model, to obtain a minimum difference between first status information and the second status information that are estimated in advance. The life calculator 230 may be implemented in one or more processors.

The user history storage 231 is a non-transitory computer memory storage. The user history storage 231 may store user history information. The user history information may include, for example, a scheme of discharging and charging a battery during an arbitrary period of time (for example, six months). For example, in a case in which a battery is mounted in an electric vehicle, user history information stored in the user history storage 231 may include a position of the electric vehicle, a speed of the electric vehicle, and information on a voltage, a current and a temperature of the battery during driving, an amount of the battery used for activities other than driving (for example, usage of an air conditioner or a heater, or other activities), an external weather, an outside temperature, and the like. The position of the electric vehicle may include, for example, information on an altitude, latitude and longitude of the electric vehicle using a global positioning system (GPS).

Additionally, the user history information may include a number of times each partial cycling occurs for an arbitrary period of time in which a user uses a battery. The life calculator 230 may extract statistical information based on the number of times each partial cycling occurs. The statistical information may include information associated with a probability that partial cycling occurs. For example, the life calculator 230 may apply a Bayesian analysis and Monte Carlo simulation approaches to user history information that is collected in advance, and may extract statistical information from the user history information.

The output device 232 outputs information regarding the RUL to a user. The output device 232 may be implemented as a display screen or a mechanical display, such as an LCD screen on a dashboard of an electric vehicle, a monitor of a computing device, or a dial face with a needle; however, the output device 232 is not limited to these examples.

Figure 3:
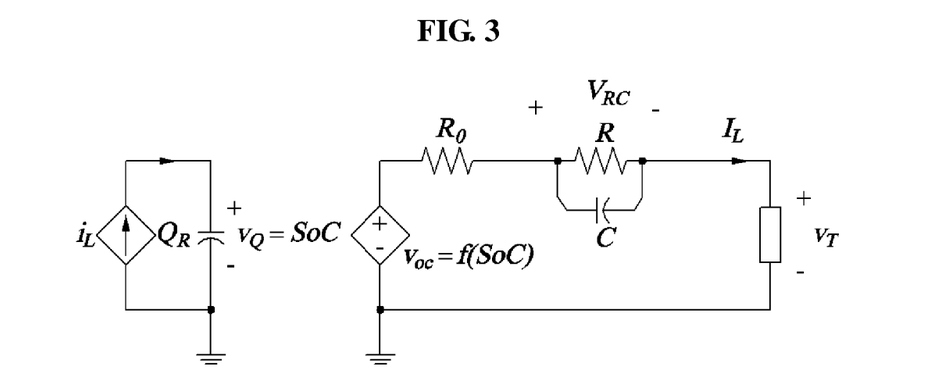
FIG. 3 is a diagram illustrating an example of a resistor-capacitor (RC) equivalent circuit corresponding to a battery.

FIG. 3 illustrates an example of a resistor-capacitor (RC) equivalent circuit corresponding to a battery.

Hereinafter, an equivalent model of a battery may refer to an RC equivalent circuit. In FIG. 3, a single RC pair is used to perform modeling of a battery relaxation effect. Additionally, to represent a relationship between an SOC and an open circuit voltage (OCV), a lookup table based on experimental data may be used. An SOC of FIG. 3 may refer to a charge state of a capacitor to which a voltage of $V_Q$ is applied and in which charge of $Q_R$ is stored, and may be, for example, a ratio of an amount of charge stored in the capacity to a total capacity in percentage. Additionally, a relationship between an OCV ($V_{OC}$) and an SOC may be represented as a partial linear relationship, as shown in Equation 4 below.

$$V_{OC} = b_0 + b_1 \cdot SOC \quad \text{[Equation 4]}$$

In Equation 4, $V_{OC}$ denotes an OCV, SOC denotes an amount of charge stored in a battery, and $b_0$ and $b_1$ denote coefficients representing a linear relationship between an OCV and an SOC.

$$\begin{cases} \begin{bmatrix} S\dot{O}C \\ \dot{V}_{RC} \end{bmatrix} = \begin{bmatrix} 0 & 0 \\ 0 & -\frac{1}{RC} \end{bmatrix} \begin{bmatrix} SOC \\ V_{RC} \end{bmatrix} + \begin{bmatrix} 1/Q_R \\ 1/C \end{bmatrix} i_L \\ v_T = [b_1 \ 1] \begin{bmatrix} SOC \\ V_{RC} \end{bmatrix} + R_0 i_L + b_0 \end{cases} \quad \text{[Equation 5]}$$

Equation 5 may be a state space equation corresponding to an electrical model of a battery represented by FIG. 3 and Equation 4. In Equation 5, a state variable is an SOC of a battery and a voltage $V_{RC}$ applied to an RC pair, and $Q_R$ denotes a nominal capacity of a battery.

To estimate an SOC, that is, a state variable in Equation 5, internal parameters $b_0$, R, C, $R_0$, and $b_1$ of an equivalent model may need to be derived. The internal parameters other than the internal parameter $b_1$ may be derived using a typical parameter identification scheme. The internal parameter $b_1$ may be determined using an OCV-SOC lookup table generated in advance based on experimental data.

Figure 4:
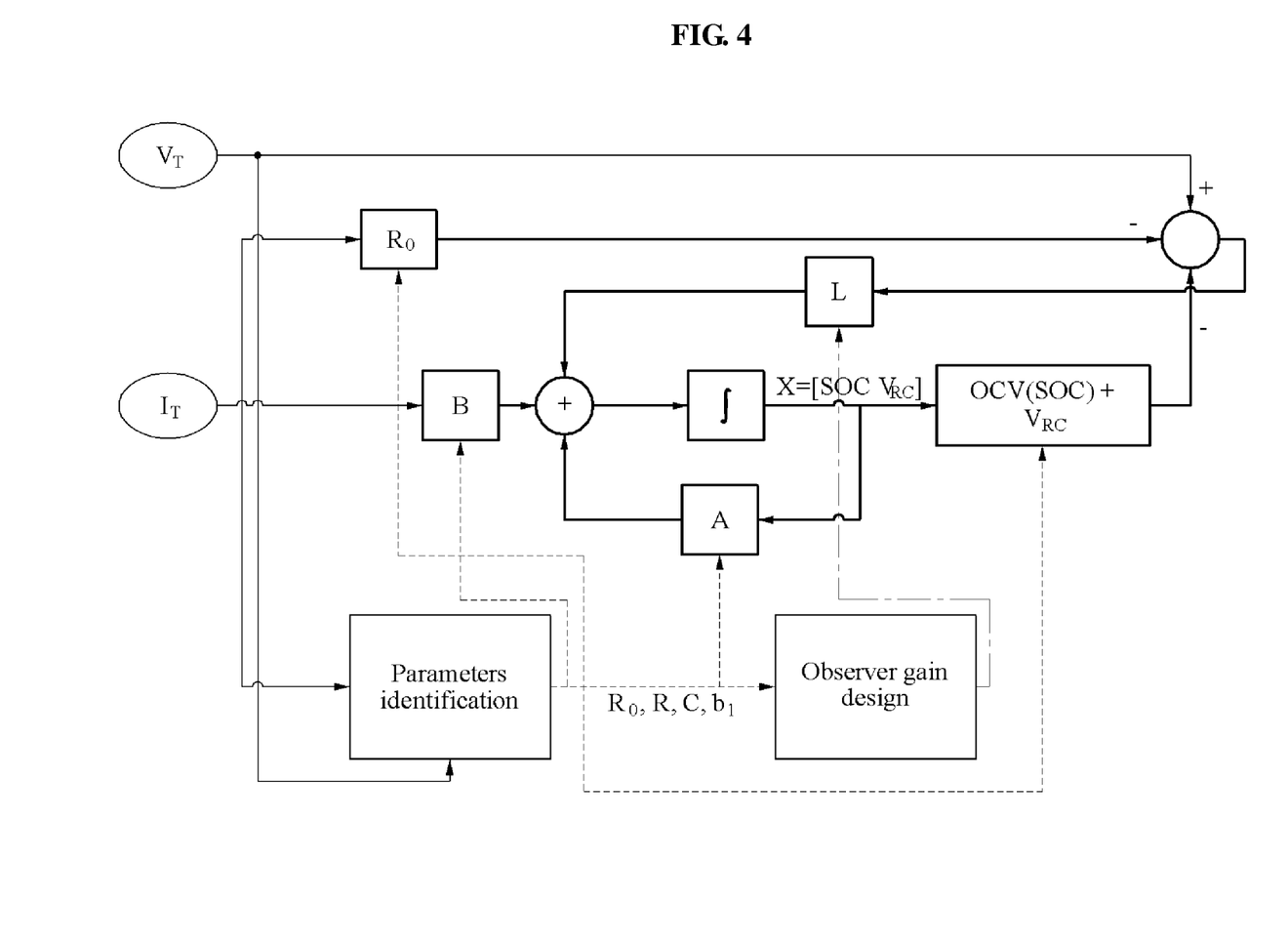
FIG. 4 is a diagram illustrating an example of a battery parameter estimator.

FIG. 4 illustrates an example of a battery parameter estimator.

In this example, a first estimator includes the battery parameter estimator of FIG. 4.

Provided that battery parameters are estimated as $\{\hat{R},\hat{C},\hat{R}_0,\hat{b}_1,\hat{b}_0\}$, an equivalent model of a battery may be represented as shown in Equation 6 below.

$$\begin{cases} \dot{x} = Ax + Bu \\ y = Cx + Du + b_0 \end{cases} \quad \text{[Equation 6]}$$

In Equation 6, $x_1 = SOC$, $x_2 = V_{RC}$, $$A = \begin{bmatrix} 0 & 0 \\ 0 & -\frac{1}{RC} \end{bmatrix}, B = \begin{bmatrix} 1/Q_R \\ 1/C \end{bmatrix},$$

$C = [b_1 \ 1]$, $D = R_0$, $u = I_L$, $y = V_T$, and $$x = \begin{bmatrix} x_1 \\ x_2 \end{bmatrix}.$$

The above-described variable and internal parameter may be shown in FIG. 3. $R_0$ denotes an internal resistance of a battery. A parameter identification block of FIG. 4 may be used to identify internal parameters $b_0$, R, C, $R_0$, and $b_1$ of an equivalent model, using a typical parameter identification scheme, a lookup table, and the like.

A parameter estimator may be represented as shown in Equation 7 below.

$$\begin{cases} \dot{\hat{x}} = A\hat{x} + Bu + L(y - \hat{y}) \\ \hat{y} = C\hat{x} + Du + b_0 \end{cases} \quad \text{[Equation 7]}$$

In Equation 7, $L^T = [L_x, L_y]$ denotes a gain vector of a parameter estimator. Gain vectors L and $L^T$ may be determined from internal parameters by an observer gain design block of FIG. 4. Variables and parameters of Equation 7 may be shown in FIG. 4.

Figure 5:
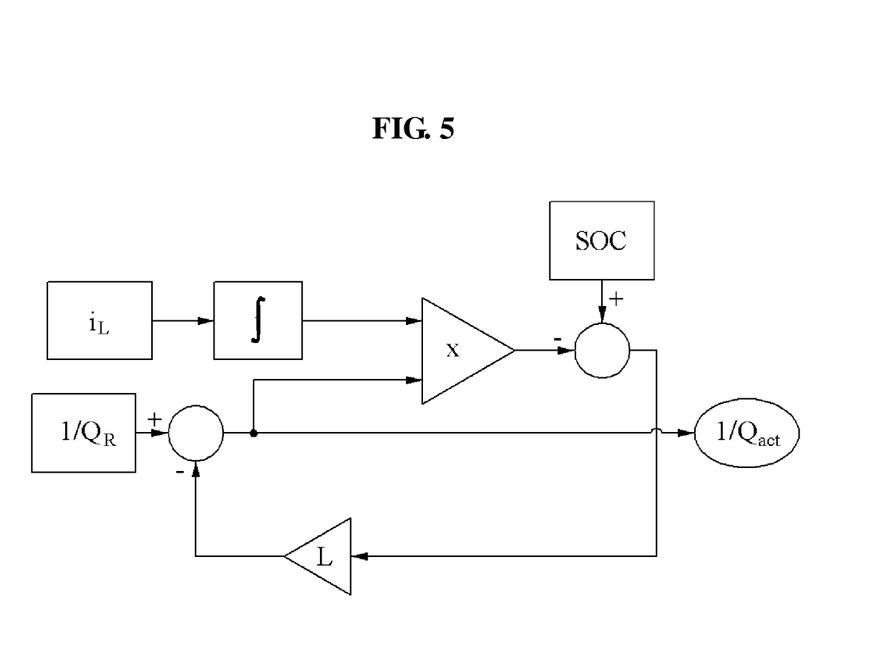
FIG. 5 is a diagram illustrating an example of a battery capacity observer.

FIG. 5 illustrates an example of a battery capacity observer.

Based on a coulomb counting method, a relationship between an SOC and an actual capacity of a battery may be represented as shown in Equations 8 and 9 below.

$$S\dot{O}C = \frac{1}{Q_{act}} \cdot I \quad \text{[Equation 8]}$$

$$\begin{cases} Q(k+1) = Q(k) + w(k) \\ SOC(k+1) = SOC(k) + \frac{1}{Q(k)} \cdot I_L \\ y(k) = SOC(k) \end{cases} \quad \text{[Equation 9]}$$

In Equations 8 and 9, Q(k) and $Q_{act}$ that is shown in FIG. 5 each denote an actual capacity of a battery, and w(k) denotes Gaussian noise. A battery capacity observer configured to estimate a capacity of a battery may be represented as shown in Equation 10 below.

$$\hat{Q}(k+1) = \hat{Q}(k) + L(\hat{y}(k) - y(k)) \quad \text{[Equation 10]}$$

In Equation 10, and $\hat{Q}(k)$ of FIG. 5 each denote an estimated value of an actual capacity of a battery, and $\hat{y}(k)$ denotes an output estimated value of a system represented as shown in Equation 11 below.

$$\begin{cases} S\hat{O}C(k+1) = S\hat{O}C(k) + \frac{1}{\hat{Q}(k)} \cdot I_L \\ \hat{y}(k) = S\hat{O}C(k) \end{cases} \quad \text{[Equation 11]}$$

Figure 6:
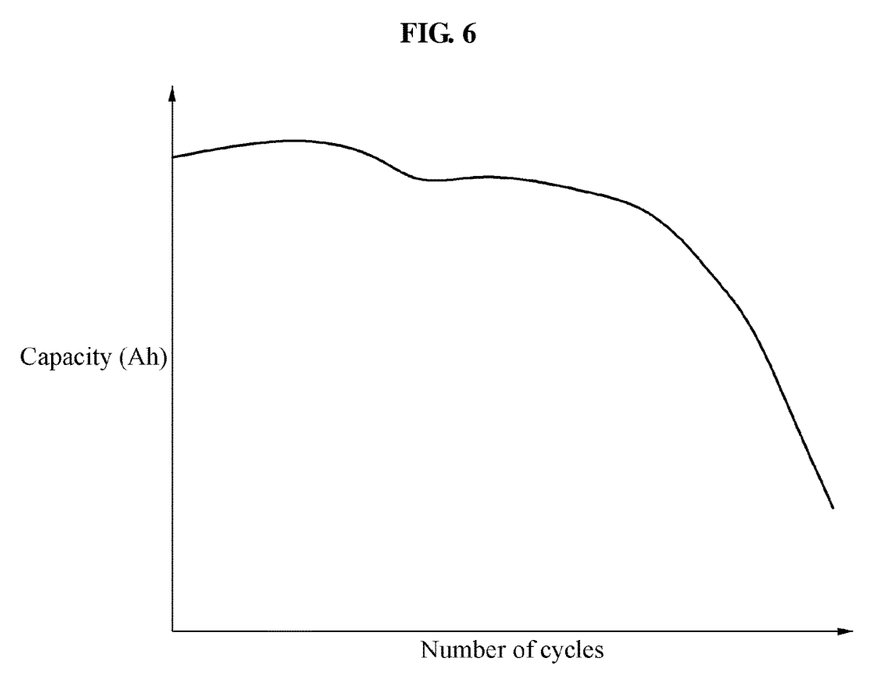
FIG. 6 is a graph illustrating an example of a battery degradation model based on number of battery cycles.

FIG. 6 illustrates an example of a battery degradation model corresponding to multiple charge and discharge cycles.

In FIG. 6, an x-axis represents counts for full charge cycles, and a y-axis represents a capacity of a battery. When a number of full charge cycles increases, a capacity of a battery tends to decrease. For example, a full cycle model and a partial cycle model may be constructed based on battery charge/discharge data that is experimentally acquired for a battery.

Figure 7:
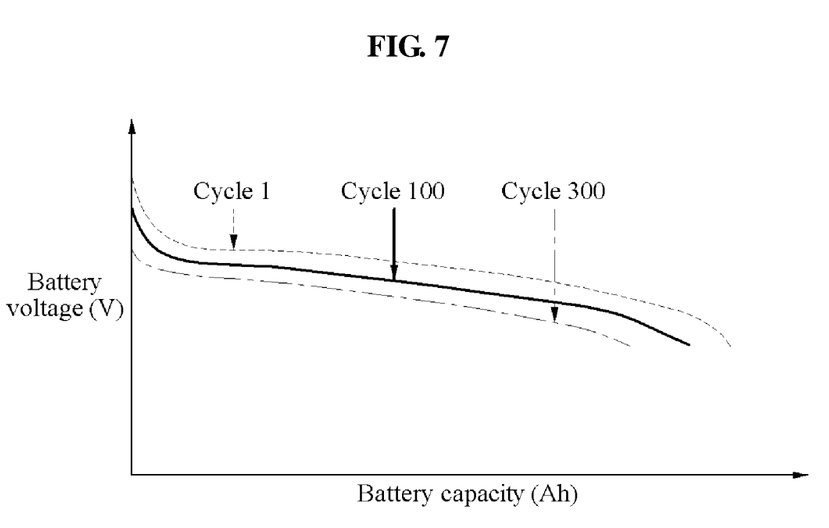
FIG. 7 is a graph illustrating an example of a battery degradation model based on number of full battery charge cycles.

FIG. 7 illustrates an example of a battery degradation model based on a total number of full charge cycles.

In FIG. 7, an x-axis represents a battery capacity, and a y-axis represents a battery voltage. Additionally, full cycle counts for the three curves correspond to "1," "100," and "300," indicating the total number of battery charge cycles and the corresponding changes in battery voltage profile.

As illustrated, typically, when a full cycle count decreases, a capacity of a battery increases at the same voltage under same discharging current. A full cycle model and a partial cycle model may be constructed based on charge/discharge data that is experimentally acquired for a battery. For example, the partial cycle model may be constructed based on a large number of batteries that may be used in an electronic device.

Figure 8:
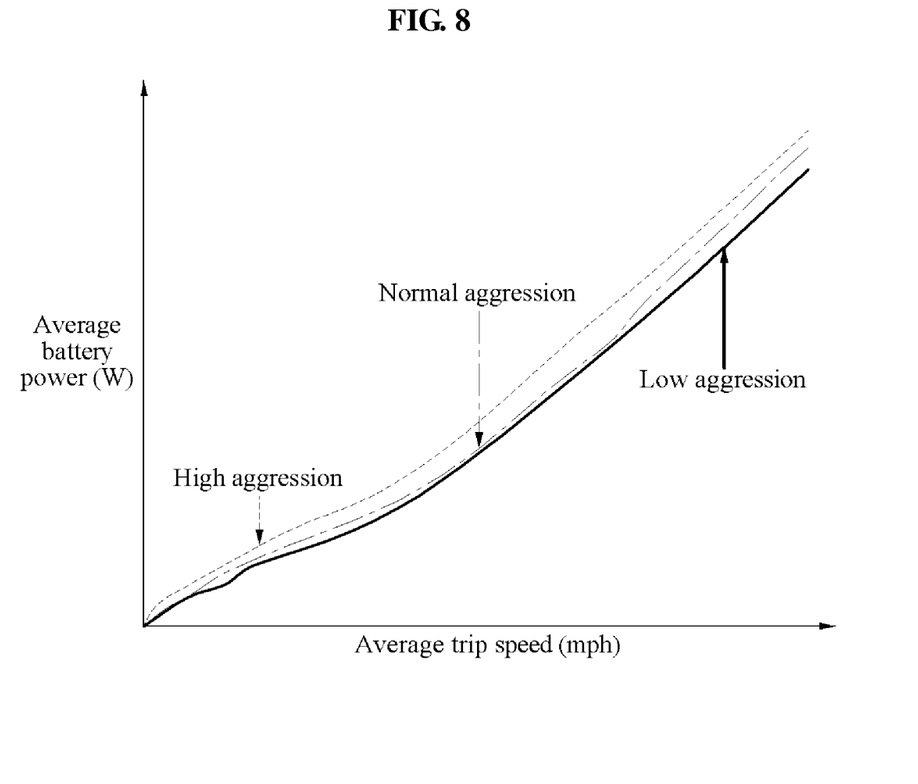
FIG. 8 is a graph illustrating an example of an average speed-average battery power model based on a record of a driving style of a driver.

FIG. 8 illustrates an example of an average speed-average battery power model based on a driving style of a driver.

FIG. 8 illustrates a relationship between an average speed of an electric vehicle and an average battery power based on a driving style of a driver when a battery is mounted in the electric vehicle. In FIG. 8, an x-axis represents the average speed, and a y-axis represents the average battery power.

The average battery power may be changed based on the driving style, despite the same average speed. In FIG. 8, "low aggression" indicates an example in which the electric vehicle is less aggressively driven, and "normal aggression" indicates an example in which the electric vehicle is normally driven. Additionally, "high aggression" indicates an example in which the electric vehicle is more aggressively driven, for example, is suddenly accelerated or suddenly stopped. Accordingly, more battery power may be consumed when a level of aggression increases. According to one example, the driving style of a driver may be obtained by retrieving the pattern of use of an electric vehicle as obtained from the electric vehicle.

Figure 9:
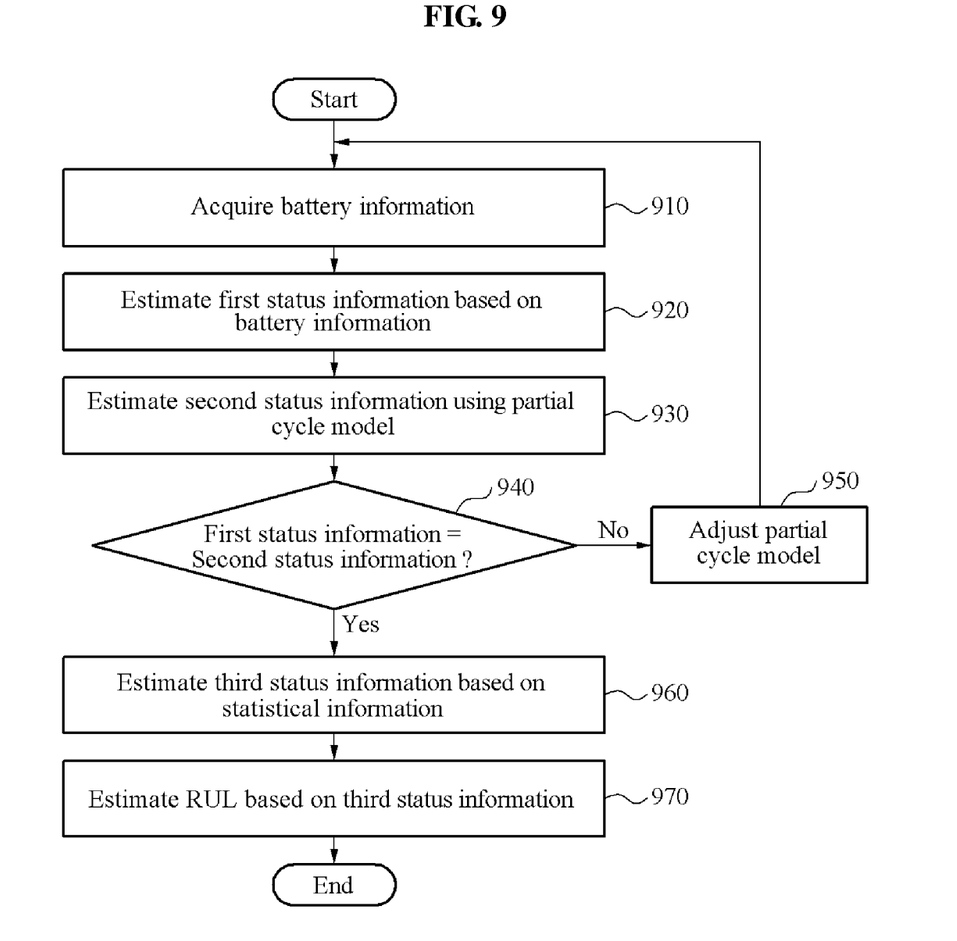
FIG. 9 is a flowchart illustrating an example of a method of estimating a remaining useful life of a battery.

FIG. 9 illustrates an example of a method of estimating a remaining useful life of a battery.

Referring to FIG. 9, in operation 910, a sensor acquires battery information. The battery information may include, for example, a voltage, a current, a temperature, a cycle count, or a partial cycle count of a battery, but not limited thereto. Accordingly, the cycle count and the partial cycle count may be determined by a first estimator or a life calculator based on the battery information.

In operation 920, the first estimator estimates first status information based on the battery information. For example, the first estimator may apply the battery information sensed by the sensor to a state space (for example, a state space equation) corresponding to an equivalent model, and may estimate an internal parameter of the equivalent model, for example, an internal resistance, and the like. Additionally, the first estimator may estimate an SOC and a capacity of a battery, using a parameter estimator and a battery capacity observer. The first estimator may count full cycles and partial cycles based on the estimated SOC, to apply a full cycle count and a partial cycle count to a partial cycle model.

In operation 930, a second estimator estimates second status information based on the partial cycle model. For example, the second estimator may apply a partial cycle count to a partial cycle model stored in a model storage, and may estimate an internal resistance and a capacity of a battery. In this example, the partial cycle count may be obtained by the first estimator or the sensor.

In operation 940, the life calculator determines whether the first status information is identical to the second status information. For example, when a difference between the first status information and the second status information is equal to or less than a predetermined difference, the life calculator may determine that the first status information is identical to the second status information.

When the first status information is determined to differ from the second status information, the life calculator adjusts the partial cycle model in operation 950. For example, the life calculator may change a structure of the partial cycle model used to estimate the remaining useful life, using a model prediction adaptation approach and a least square fitting technique, and may allow the second status information to be matched to the first status information. In this example, the life calculator may change a degree of an equation or a model parameter of the partial cycle model. However, there is no limitation thereto and accordingly, the second estimator or the model storage may adjust the partial cycle model, based on a determination of the life calculator.

In operation 960, the life calculator estimates third status information based on statistical information. The statistical information may be extracted from user history information, and may include, for example, information associated with a probability that a partial cycle is to occur. For example, the life calculator may estimate a predictive partial cycle count based on the probability, and may estimate a capacity and an internal resistance of a battery by applying the predictive partial cycle count to the partial cycle model. The predictive partial cycle count may refer to a number of times a partial cycle is predicted to occur.

For example, the life calculator may predict a future capacity and a future internal resistance, based on a capacity and an internal resistance measured at a point in time at which a user uses a device, using a Bayesian inference and a Monte Carlo simulation approach. In this example, a partial cycle may be transformed in a unit of time (for example, a year, a month, or a day).

In operation 970, the life calculator estimates the remaining useful life based on the third status information. For example, the life calculator may calculate an amount of time in which the third status information reaches to an EOL, and may estimate the remaining useful life.

Figure 10:
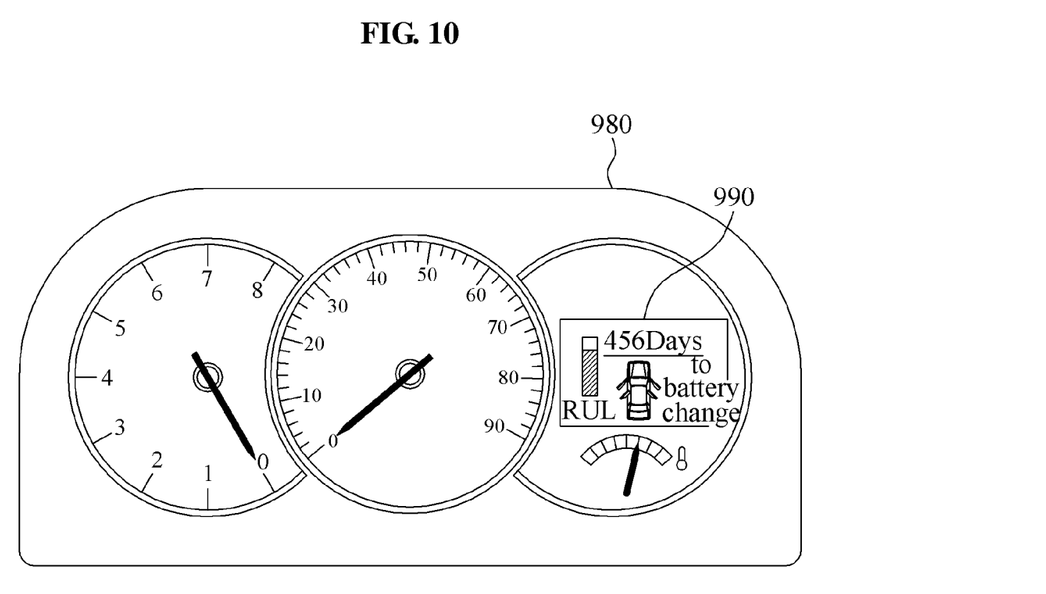
FIG. 10 is a diagram illustrating an example of a dashboard of an electric vehicle including an example of an apparatus for estimating a remaining useful life.

FIG. 10 illustrates an example of a dashboard of an electric vehicle including an apparatus for estimating a remaining useful life.

Referring to FIG. 10, the electric vehicle may include within its dashboard 980 an output device of the apparatus for estimating the remaining useful life. In this example, the dashboard 980 includes a display screen 990 that is configured to output information regarding the remaining useful life of the battery within the electric vehicle. The display screen 990 may be used to display exclusively the remaining useful life information or be used to display other information regarding the vehicle, such as GPS navigation information, target oil change date, engine health or other vehicle maintenance information. In one example, the apparatus may use battery information of a battery detected by a sensor and information regarding past partial and full charge cycles of an electric vehicle to which the battery is installed to estimate the remaining useful life of the battery. Thus, the apparatus may accurately estimate the remaining useful life based on the past driving pattern of a driver of the electric vehicle. In addition, the driver of the electric vehicle may be informed of the remaining useful life of the battery intermittently via the display screen 990. Accordingly, the driver may replace the battery at a suitable time to ensure safety and convenience.

As described above, according to various examples, a method and apparatus for estimating a remaining useful life of a battery may be applicable to a battery management system (BMS), for example, an electric vehicle, an energy storage apparatus, or a home appliance.

For example, the method and apparatus for estimating a remaining useful life of a battery may be applicable to an electric vehicle using only a battery as an energy source, an energy storage apparatus using a large number of secondary batteries, and various home appliances using secondary batteries.

In an example, when a method and apparatus for estimating a remaining useful life of a battery are applied to an electric vehicle, a user may accurately verify a remaining useful life of a battery in the electric vehicle, and may know an appropriate time to replace the battery. When an exact time to replace a battery is known in advance, the user may prevent a vehicle safety accident from occurring due to a failure of the battery that is only a power source of the electric vehicle. Additionally, electric vehicle producers may provide appropriate quality assurance of products based on accurate estimation of a remaining useful life of a battery.

In another example, when a method and apparatus for estimating a remaining useful life of a battery are applied to a large-capacity battery bank used in a data center or a smart grid, a user may verify a remaining useful life of each of a plurality of battery packs forming the battery bank, and may know an appropriate time to replace each of the battery packs. For example, when battery packs of a battery bank are recyclable, the battery packs may be replaced at different points in time, due to different states of the battery packs. The user may stably operate the battery bank, by preventing the battery bank from malfunctioning or stopping due to a failure of battery packs, based on an appropriate time to replace each of the battery packs that is accurately estimated. Additionally, it is possible to reduce costs for additional failure inspection of the battery packs.

The units described herein may be implemented using hardware components, software components, or a combination thereof. For example, the hardware components may include microphones, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The non-transitory computer readable recording medium may include any data storage device that can store data which can be thereafter read by a computer system or processing device. Examples of the non-transitory computer readable recording medium include read-only memory (ROM), random-access memory (RAM), CD-ROMs, magnetic tapes, floppy disks, optical data storage devices. Also, functional programs, codes, and code segments that accomplish the examples disclosed herein can be easily construed by programmers skilled in the art to which the examples pertain based on and using the flow diagrams and block diagrams of the figures and their corresponding descriptions as provided herein.

As a non-exhaustive illustration only, a terminal or device described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

The display device as described herein may refer to any physical device that provides a visual output to a user. The display device may be implemented as a liquid crystal display (LCD), a light-emitting diode (LED) display, a plasma display panel (PDP), a screen, a terminal, a mechanical device including a dial face and a needle, and the like. A screen may be a physical structure that includes one or more hardware components that provide the ability to render a user interface and/or receive user input. The screen can encompass any combination of display region, gesture capture region, a touch sensitive display, and/or a configurable area. The screen can be embedded in the hardware or may be an external peripheral device that may be attached and detached from the apparatus. The display may be a single-screen or a multi-screen display. A single physical screen can include multiple displays that are managed as separate logical displays permitting different content to be displayed on separate displays although part of the same physical screen.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of estimating battery life, the method comprising:
    acquiring, from a battery, battery information;
    calculating first status information of the battery based on the battery information, the first status information comprising a first internal parameter of the battery;
    acquiring a partial cycle model modeling a battery degradation pattern caused by a number of partial cycles of the battery;
    determining a partial cycle count of the battery;
    calculating, by applying the partial cycle model to the partial cycle count, second status information, the second status information comprising a second internal parameter of the battery;
    comparing the first status information and the second status information to generate a comparison result;
    calculating the battery life based on the comparison result; and
    adjusting a structure of the partial cycle model to match the second status information with the first status information, in response to the comparison result indicating that the first status information differs more than a threshold amount from the second status information.

2. The method of claim 1, wherein the calculating comprises, upon the comparison result indicating that the first status information is within a threshold range of the second status information, using the partial cycle model to calculate the battery life based on user history information.

3. The method of claim 2, wherein:
    the battery life corresponds to a remaining useful life of the battery; and
    the calculating of the battery life from the user history information comprises
        extracting statistical information associated with the partial cycle model from the user history information,
        calculating third status information of the battery based on the statistical information, and
        calculating the remaining useful life based on the third status information.

4. The method of claim 3, wherein the estimating of the third status information comprises:
    estimating, from the statistical information and using the partial cycle model, a predictive partial cycle count of a number of future partial cycles of the battery; and
    calculating, as the third status information, either one or both of a predicted future capacitance or a predicted future internal resistance based on the predictive partial cycle count by applying the partial cycle model to the predictive partial cycle count.

5. The method of claim 1, wherein the partial cycle model is a model derived by transforming a full cycle model associated with a degradation caused by a full charge and discharge of the battery.

6. The method of claim 1, wherein the estimating of the first status information comprises:
    acquiring an equivalent model corresponding to the battery; and
    estimating, as the first status information and using the battery information and the equivalent model, an internal parameter of the equivalent model.

7. The method of claim 6, wherein the estimating of the internal parameter comprises estimating, as the first status information, the internal parameter using a state space corresponding to the equivalent model.

8. The method of claim 1, wherein the estimating of the second status information comprises estimating, as the second status information, either one or both of a capacitance and an internal resistance estimated from a partial cycle count of the battery using the partial cycle model.

9. The method of claim 1, wherein the battery information comprises any one or any combination of any two or more of a voltage, a current, a temperature, a cycle count, or a partial cycle count of the battery.

10. An apparatus for estimating battery life, the apparatus comprising:
    a processor configured to
        acquire, from a battery, battery information;
        calculate first status information of the battery based on the battery information, the first status information comprising a first internal parameter of the battery,
        acquire a partial cycle model modeling a battery degradation pattern caused by a number of partial cycles of the battery,
        determine a partial cycle count of the battery,
        calculate, by applying the partial cycle model to the partial cycle count, second status information of the battery, the second status information comprising a second internal parameter of the battery,
        compare the first status information and the second status information to generate a comparison result,
        calculate the battery life based on the comparison result, and
        adjust a structure of the partial cycle model to match the second status information with the first status information, in response to the comparison result indicating that the first status information differs more than a threshold amount from the second status information.

11. The apparatus of claim 10, wherein the processor is further configured to, upon the comparison result indicating that the first status information is within a threshold range of the second status information, use the partial cycle model to calculate the battery life based on user history information.

12. The apparatus of claim 11, wherein:
    the battery life corresponds to a remaining useful life of the battery; and
    the processor is further configured to
        extract statistical information associated with the partial cycle model from the user history information,
        calculate third status information of the battery based on the statistical information, and
        calculate the remaining useful life based on the third status information.

13. The apparatus of claim 12, wherein the processor is further configured to:
    estimate, from the statistical information and using the partial cycle model, a predictive partial cycle count of a number of future partial cycles of the battery; and
    calculate, as the third status information, either one or both of a predicted future capacitance or a predicted future internal resistance based on the predictive partial cycle count, by applying the partial cycle model to the predictive partial cycle count.

14. The apparatus of claim 10, further comprising:
    a model storage configured to store the partial cycle model, wherein the partial cycle model is a model derived by transforming a full cycle model associated with a degradation caused by a full charge and discharge of the battery.

15. The apparatus of claim 10, wherein the processor is further configured to:
acquire an equivalent model corresponding to the battery; and
estimate, as the first status information and using the battery information and the equivalent model, an internal parameter of the equivalent model.

16. The apparatus of claim 15, wherein the processor is further configured to estimate, as the first status information, the internal parameter using a state space corresponding to the equivalent model.

17. The apparatus of claim 10, wherein the second estimator is configured to estimate, as the second status information, either one or both of a capacitance and an internal resistance estimated from a partial cycle count of the battery using the partial cycle model.

18. The apparatus of claim 10, wherein the battery information comprises any one or any combination of any two or more of a voltage, a current, a temperature, a cycle count, or a partial cycle count of the battery.

19. An apparatus for estimating battery life, the apparatus comprising:
a sensor configured to detect battery performance information of a battery that powers a device, the battery performance information comprising any one or any combination of any two or more of a voltage, a current, a temperature, a cycle count, or a partial cycle count of the battery; and
a processor configured to
extract, from the battery performance information, status information indicating either one or both of a capacitance or an internal resistance of the battery,
retrieve historic data comprising past partial charge cycles of the battery from a memory storage,
estimate a battery life of the battery based on the status information and the historic data by applying, to the battery performance information and the historic data, a partial cycle model corresponding to a battery degradation pattern to estimate the battery life, and
adjust a structure of the partial cycle model to match a second status information with a first status information, in response to the comparison results indicating that the first status information differs more than a threshold amount from the second status information,
wherein the first status information is calculated from the status information and the second status information is calculated based on the partial cycle model.

20. The apparatus of claim 19, wherein the battery life corresponds to a remaining useful life of the battery.

21. An electric vehicle comprising:
a battery compartment configured to hold the battery; and
the apparatus of claim 19, wherein the apparatus further comprises a display screen configured to output information regarding the battery life to a dashboard of the electric vehicle.

* * * * *